United States Patent [19]
Kasten

[11] 4,420,766
[45] Dec. 13, 1983

[54] REVERSIBLY PROGRAMMABLE POLYCRYSTALLINE SILICON MEMORY ELEMENT

[75] Inventor: Alan J. Kasten, Palm Bay, Fla.

[73] Assignee: Harris Corporation, Melbourne, Fla.

[21] Appl. No.: 232,520

[22] Filed: Feb. 9, 1981

[51] Int. Cl.³ .......................................... H01L 45/00
[52] U.S. Cl. ........................................ 357/59; 357/1; 357/51; 357/57
[58] Field of Search ................. 357/59, 1, 2, 3, 4, 357/6, 51, 57

[56] References Cited
U.S. PATENT DOCUMENTS

| | | | |
|---|---|---|---|
| 3,460,007 | 8/1969 | Scott, Jr. | 357/59 |
| 3,504,239 | 3/1970 | Johnson et al. | 357/51 |
| 4,110,776 | 8/1978 | Rao et al. | 357/23.5 |
| 4,146,902 | 3/1979 | Tanimoto et al. | 357/59 |
| 4,199,692 | 4/1980 | Neale | 357/2 |
| 4,210,996 | 7/1980 | Amemiya et al. | 357/59 |

Primary Examiner—William D. Larkins
Attorney, Agent, or Firm—Leitner, Palan, Martin & Bernstein

[57] ABSTRACT

A polycrystalline silicon memory element having an impurity concentration in the range of $10^{17}$ to $10^{20}$ atoms per cubic centimeter is reversibly switchable from a high to a low resistance state through a negative resistance region using a voltage above the threshold having a ramped trailing edge.

3 Claims, 11 Drawing Figures

VPNME
5 x 10⁻³ COUL
125°C

VPNME
1 x 10⁻³ COUL
125°C

VPNME
1 x 10⁻³ COUL
125°C

REVERSIBLY PROGRAMMABLE POLYCRYSTALLINE SILICON MEMORY ELEMENT

BACKGROUND OF THE INVENTION

The present invention relates generally to memory elements and more specifically to the use of polycrystalline silicon as a non-volatile memory element.

For the storage of a large quantity of data in as small an amount of space as possible, the industry has turned towards semiconductor memory elements. A first group of elements comprises the read only memories (ROM) which are manufactured or delivered to the end user with specific ones and zeros stored in the memory locations. A second group comprises programmable read only memories (PROM) which are memory elements which may be programmed by the user to produce irreversibly ones or zeros where desired in the memory array. A third group of semiconductor memories comprises electrically alterable read only memories (EAROM) which are memory elements which may be switched between one and zero non-volatile states. A fourth class of semiconductor memories are random access memories (RAM) which generally differ from the electrically alterable read only memories in their speed of writing and erasing. Also, RAM's are generally volatile elements which lose their memory state when not biased.

Because of their versatility, a major development in the industry has been directed to electrically alterable read only memories and random access memories. One branch of this development has been research in amorphous chalcogenide memory elements. These amorphous memory elements are non-volatile and switch from a high to a low resistance state upon application of a voltage higher than a threshold voltage. They have generally been used in slow write electrically alterable read only memories. Their use as a non-volatile fast read and write random access memory is described in U.S. Pat. No. 4,199,692, wherein the speed of amorphous chalcogenide switching elements is increased by switching the element to a lower high resistance state and not into its low resistance state. The amorphous chalcogenide memory elements have generally been research and development tools and have not usually reached the production stage. Consequently much data has not been collected on the proper materials, the processing steps, and end-use limitations. Thus, although the amorphous chalcogenide memory devices seem to provide versatility of operation while minimizing surface area, they have not resulted in a proven device. There is concern that amorphous chalcogenide switching elements may not be able to operate at high temperatures. A need exists for a device which operates with the versatility of the amorphous chalcogenide memory elements using known materials and processes.

One of the most commonly used materials in semiconductor integrated circuits is silicon. The use of a high resistivity polysilicon resistor as a semiconductor switching element is shown by Tanimoto et al in U.S. Pat. No. 4,146,902. The polysilicon resistor had resistivity in the range of $10^4$ to $10^7$ ohm-centimeters and was designed for use as a programmable read only memory being switched irreversibly from a high to a low resistance value.

At the other end of the spectrum is a technique for trimming or modifying the resistance of polycrystalline silicon resistors as shown by Amemiya et al in U.S. Pat. No. 4,210,996. The technique shown requires the polycrystalline layer to have an impurity concentration higher than $1 \times 10^{20}$ atoms per cubic centimeter. The trimming technique is effectively a current annealing since the polycrystalline silicon resistor is never driven to be switched to a low resistance state.

SUMMARY OF THE INVENTION

An object of the present invention is to provide an electrically alterable read only memory element using polycrystalline silicon.

Another object of the present invention is to provide a non-volatile random access memory element using polycrystalline silicon.

Still another object of the present invention is to provide a polycrystalline silicon memory element which is non-volatile in high temperature environments.

An even further object of the present invention is to provide a polycrystalline silicon memory element which can be written and erased in high temperature environments.

These and other objects of the invention are attained by forming a polycrystalline silicon memory element having an impurity concentration in the range of $10^{17}$ to $10^{20}$ atoms per cubic centimeter. The polycrystalline silicon memory element is switched from its high to a low resistance state through a negative resistance region by the application of a voltage having a magnitude exceeding a predesigned threshold voltage of the device and including a ramp trailing edge. The polycrystalline silicon memory element is switched from its low resistance state to a high resistance state by the application of a voltage greater than a threshold voltage and including a substantially straight trailing edge.

The other objects, advantages and novel features of the present invention will become apparent from the following detailed description of the invention when considered in conjunction with the accompanying drawings.

DESCRIPTION OF THE PREFERRED EMBODIMENTS

Figure 1:
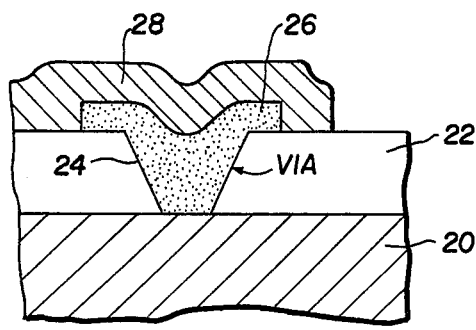
FIG. 1 is a cross-sectional view of a vertical polycrystalline silicon memory element incorporating the principles of the present invention.
Figure 10:
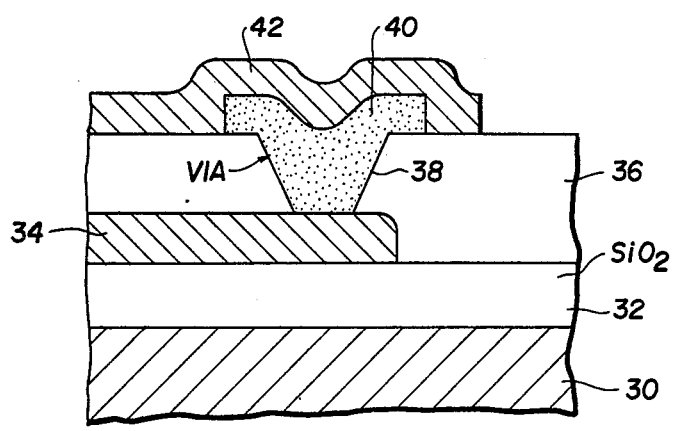
FIG. 10 is a cross-sectional view of another embodiment of a vertical polycrystalline silicon memory element according to the principles of the present invention.
Figure 11:
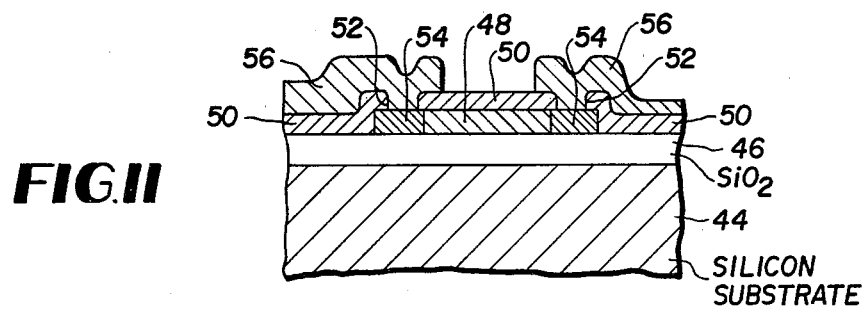
FIG. 11 is a cross-sectional view of a horizontal, polycrystalline silicon memory element according to the principles of the present invention.

A reversibly programmable polycrystalline silicon memory element according to the principles of the present invention is illustrated in FIG. 1 as being formed as a vertical element on a substrate 20. An insulative layer 22 is formed on the substrate 20 and the vertical polycrystalline silicon element 26 is positioned within a via 24 in the insulative material 22. A top contact 28 is shown connected to the top of the vertical polycrystalline silicon element 26. A substrate 20 forms the bottom contact for the vertical polycrystalline silicon element 26. Although FIG. 1 illustrates a vertical element with a substrate as a bottom contact, another vertical element is illustrated in FIG. 10 and a horizontal element is illustrated in FIG. 11. These two figures will be discussed in detail hereinafter.

A typical method of fabrication of the vertical polycrystalline silicon memory element of FIG. 1 includes beginning with the substrate 20 being an N-conductivity type having a resistivity in the range of 3 to 5 ohm-centimeters. The substrate 20 is subjected to a phosphorous deposition at, for example, 1100° C. and a drive-in at 1200° C. This forms the bottom electrode of the vertical polycrystalline memory element. An insulative layer 22, for example, silicon dioxide is formed on the substrate 20 and vias 24 are formed through the insulative layer 22 to expose surface areas of the substrate 20. Polycrystalline silicon is then deposited in the vias 24 to form the layer 26. Impurities are then introduced into the polycrystalline silicon layer 26 to define the desired resistivity of the polycrystalline silicon elements. Preferably this is carried out by ion implantation. Other methods include deposition and diffusion or introducing impurities simultaneously with the formation of the layer 26. Successfully operated polycrystalline silicon memory elements have been formed using ion implantation dosages of $5 \times 10^{-4}$ to $1 \times 10^{-2}$ coulombs at 65 KeV. The implanted impurities are then activated with, for example, a 1000° C. diffusion. The polycrystalline silicon layer 26 is delineated to form the resulting structure illustrated in FIG. 1. Also during this delineation step, polycrystalline silicon material 26 in vias which are to include a contact to the substrate 20 is also removed. An upper electrode 28 is then deposited and delineated to form the specific contact and interconnect. Although the upper contact 28 is illustrated as a single layer, it may be a multiple layer and include a layer of a titanium-tungsten alloy and a layer of aluminum. The titanium-tungsten alloy, for example, may be used as a barrier to prevent electromigration of the second interconnect layer into the polycrystalline silicon.

Figure 2:
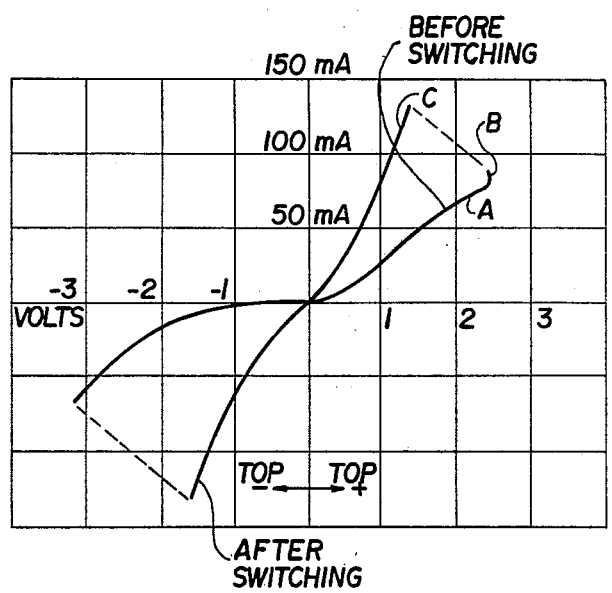
FIG. 2 is a voltage-current graph of an undoped, vertical polycrystalline silicon memory element.

Experimentations were carried out on both doped and undoped, vertical, polycrystalline silicon elements equivalent to that illustrated in FIG. 1 to determine the characteristics of the elements. As illustrated in the graph of FIG. 2, the element goes through a preswitching resistive portion A, a negative resistive portion B and a postswitching portion C. It should be noted that the characteristics are anisotropic yielding an apparently lower resistance when the top electrode is biased positively with respect to the bottom electrode than when the polarity is reversed.

Figure 3:
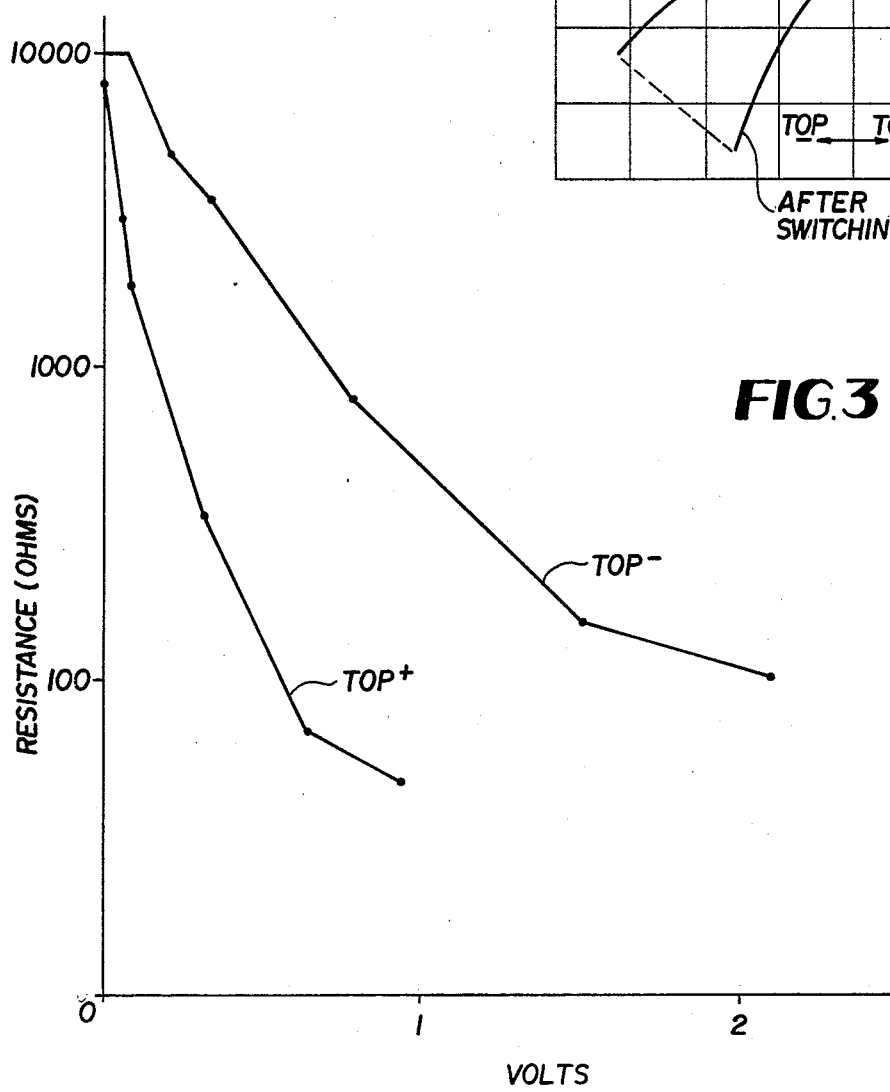
FIG. 3 is a voltage-resistance graph of an undoped, vertical polycrystalline silicon memory element.

With the application of larger and larger voltages above the threshold voltage of the element, the resistive element lowers its resistivity. FIG. 3 illustrates this rather graphically showing two curves, one wherein the top electrode is positive and the other wherein the top electrode is negative. This illustrates the preswitching resistance. It should be noted that the postswitching resistance of the element illustrated in FIG. 2 is approximately 28 to 30 ohms.

Figure 4:
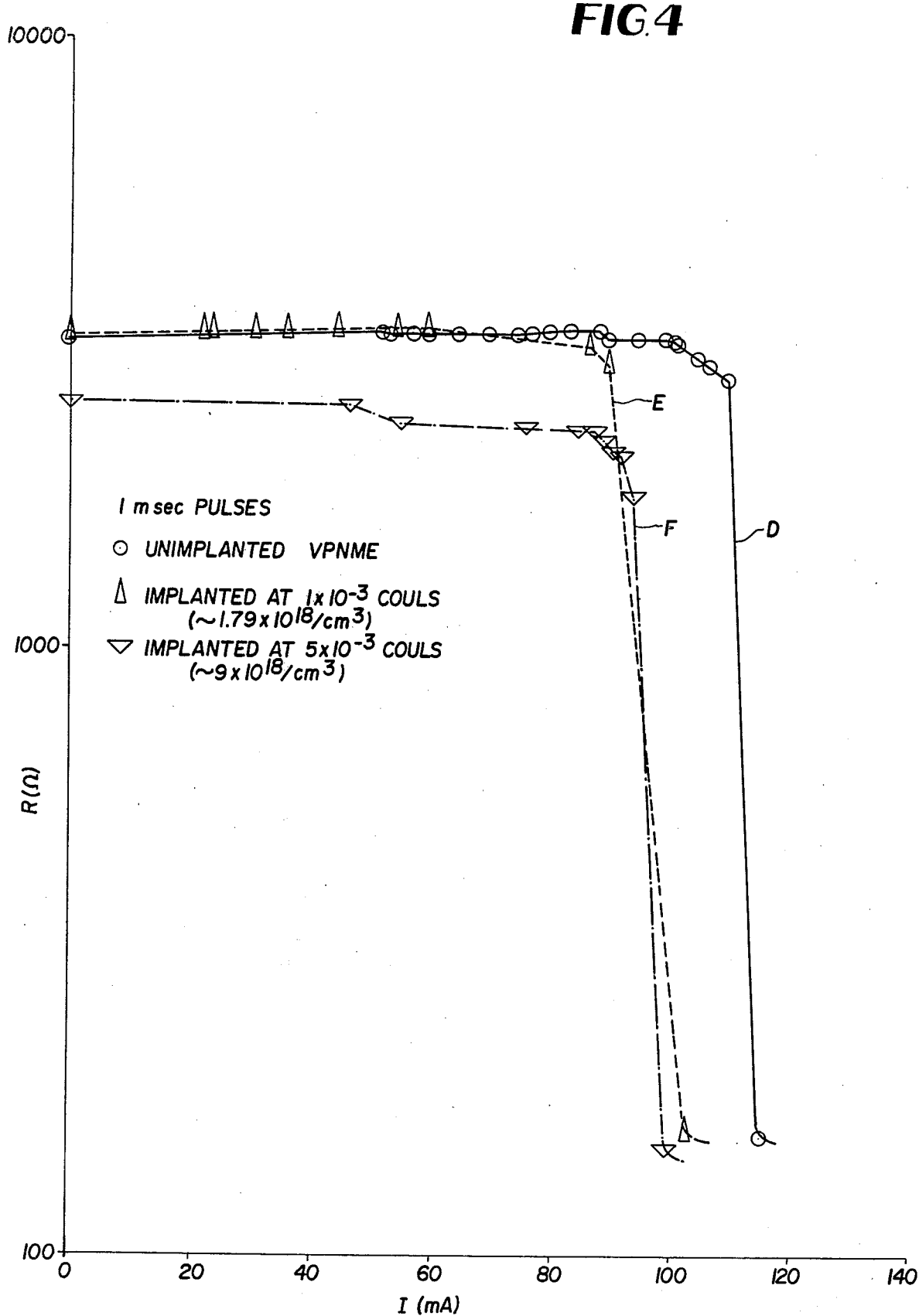
FIG. 4 is a current-resistance graph of an undoped and two doped, vertical polycrystalline silicon memory elements.

Comparison of undoped and doped vertical polycrystalline silicon memory elements is illustrated in the graph of FIG. 4. Curve D is for an unimplanted device element, curved E is an element ion implanted at $1 \times 10^{-3}$ coulombs with phosphorus resulting in an impurity concentration of approximately $1.7 \times 10^{18}$ atoms per cubic centimeter and graph F is an element implanted at $5 \times 10^{-3}$ coulombs resulting in an impurity concentration of approximately $9 \times 10^{18}$ atoms per cubic centimeter. As previously discussed, all three of the elements go through a trimming phenomenon before switching to the low resistance state through a negative resistance region. The points in the curve were developed using one millisecond pulses. Although the initial resistance of curves E and F is different, the current at which they switch is substantially the same. As is evident from FIG. 4 the unimplanted element requires a greater current to switch from a high to a low resistance state through a negative resistance region but results in a low resistance state substantially in the range of the ion implanted element's low resistance state.

Figure 5:
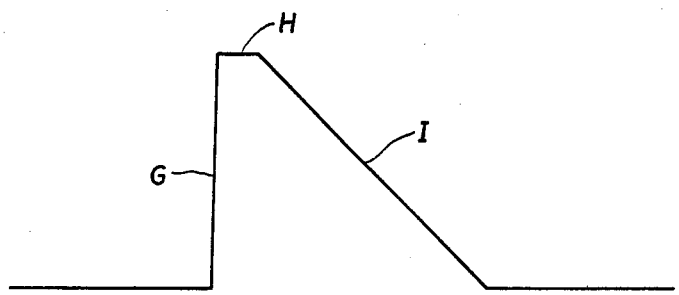
FIG. 5 is a graph of a write pulse according to the principles of the present invention.

The pulse required to switch a high resistance polycrystalline silicon device element from a high to a low resistance state is illustrated in FIG. 5. The curve includes a leading edge portion G which is substantially vertical although it may have a slight ramp, a flat portion H and a trailing ramp portion I. Although the polycrystalline silicon element switches in less than one microsecond, the voltage pulse is at least two microseconds. The pulse width includes the trailing ramp I which is very important to the mechanism which switches the polycrystalline silicon element from a high to a non-volatile low resistance state. Without the trailing edge ramp I, the element may unpredictably switch to a very high or even open-circuit resistance state. As a typical example, the flat portion H would have a duration of approximately 0.5 microseconds and the trailing edge I would have a duration of approximately 1.5 microseconds. The magnitude of the voltage applied is above the threshold value of the device which will cause it to traverse the negative resistance portion of its curve and switch from a high to a low resistance state.

Figure 6:
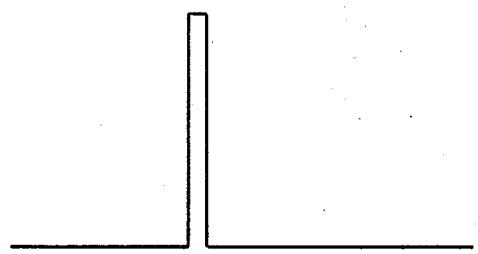
FIG. 6 is a graph of an erase pulse according to the principles of the present invention.

The erase pulse as illustrated in FIG. 6 is a very narrow pulse of an amplitude greater than the amplitude of the write pulse. A typical example wherein the amplitude of the write pulse of FIG. 5 is 13.5 volts, the amplitude of the erase pulse is 17 volts. The width of the erase pulse of FIG. 6 should be less than one microsecond and typically can be in the range of 0.1 to 0.5 microseconds.

Switching from a high to a low resistance state is considered a write operation and switching from a low to a high resistance state is an erase operation if a high resistance state is a logic 0 and the low resistance state is a logic 1. If the logic is reversed, i.e. a low resistance state is a logic 0 and a high resistance is a logic 1, FIG.

5 would be an erase pulse and FIG. 6 would be a write pulse.

Figure 7:
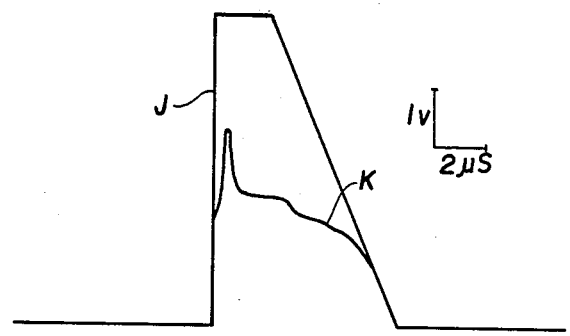
FIG. 7 is a graph of a write voltage pulse with a superimposed graph of the voltage across a vertical polycrystalline memory element at 125° C. which had been ion implanted with phosphorus at $5 \times 10^{-3}$ coulombs.
Figure 8:
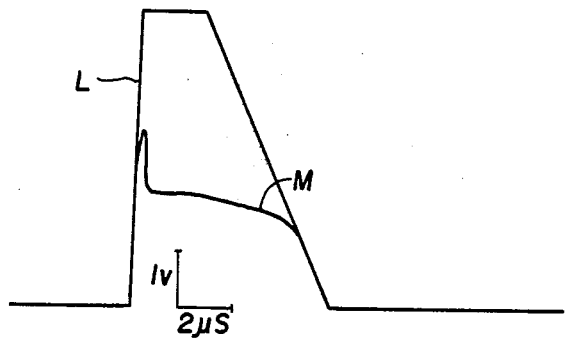
FIGS. 8 and 9 are graphs of write pulses with superimposed graphs of the voltage across a vertical polycrystalline silicon memory element at 125° C. which had been ion implanted with phosphorus at $1 \times 10^{-3}$ coulombs.
Figure 9:
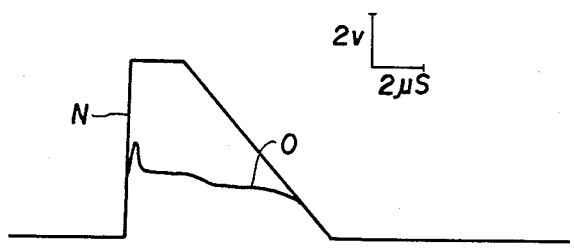

The switching phenomenon is evident in the graphs of FIGS. 7, 8 and 9 wherein the applied unloaded voltage pulse is illustrated as curves J, L and N and the actual voltage across the polycrystalline silicon element resulting from the change of resistance as is illustrated by curves K, M and O in FIGS. 7, 8 and 9, respectively. Although the switching operation of these three figures was carried out at 125° C., the characteristics would be the same at room temperature. As can be seen from these three figures, the voltage across the vertical polycrystalline silicon device follows the leading edge of the unloaded input until a threshold voltage is reached wherein it switches to the low resistance state and maintains that state following the trailing edge of the applied voltage. Although FIG. 7 is for a vertical polycrystalline silicon element ion implanted at $5 \times 10^{-3}$ coulombs, and FIG. 8 at $1 \times 10^{-3}$ coulombs, their general characteristic curves K and M are substantially similar. From these figures, it is evident that the polycrystalline silicon devices operate at several orders of magnitude faster than the chalcogenide amorphous switches.

Although undoped polycrystalline silicon devices may be switched from a high to a low resistance state and from a low to a high resistance state representing a write and erase cycle, respectively, they cannot be operated at high temperatures. It has been found that the undoped polycrystalline silicon elements have been impossible to erase at 125° C. once they have been written. Thus, it has been found by the present invention that the polycrystalline silicon material to be an effective memory device at high as well as low temperatures capable of being reversibly programmed between high and low resistance non-volatile states should have an impurity concentration in the range of $10^{17}$ to $10^{20}$ atoms per cubic centimeter. The write pulse must drive the resistance element through the negative resistance region to provide the non-volatile low resistance state. The higher the impurity concentration, the more stable the polycrystalline silicon device element is after switching. At impurity concentrations above the range of the present invention the element becomes very difficult to return to a high resistance state by means of an erase pulse.

Another vertical polycrystalline silicon element is illustrated in FIG. 10 as including a substrate 30 covered by an insulative layer 32. A bottom contact 34 is formed on the insulative layer 32 and subsequently covered with a second insulative layer 36. A via 38 is formed in the insulative layer 36 and the vertical polycrystalline silicon element 40 is formed therein. A top contact 42 is formed on the top of the polycrystalline silicon element 40. For vertical polycrystalline silicon memory elements in the resistive range discussed, preferably the diameter of the elements should be no greater than 0.15 mils in order to have practically attainable threshold voltages.

FIG. 11 illustrates a horizontal polycrystalline silicon element. A substrate 44 is covered by an insulative layer 46 upon which is applied a polycrystalline silicon layer 48. Impurities are introduced into layer 48 to define the appropriate element. This is followed by the formation of a second insulative layer 50 which is patterned to provide contact apertures 52 therein to the polycrystalline silicon layer 48. Additional impurities are introduced in the apertures 52 to form low resistance contact regions 54 of the polycrystalline silicon layer 48. Contact layers 56 are then formed through the vias 52 to the contact regions 54 of the polycrystalline silicon layer 48. The operation of the elements of FIGS. 10 and 11 are substantially similar to that of FIG. 1. The vertical embodiment is preferred for its space savings and better operating charcteristics.

From the preceding description of the preferred embodiments, it is evident that the objects of the invention are attained in that a polycrystalline silicon memory element is provided which may be reversibly programmed and operated at extreme environmental temperatures. Although the invention has been described and illustrated in detail, it is to be clearly understood that the same is by way of illustration and example only and is not to be taken by way of limitation. The spirit and scope of the invention are to be limited only by the terms of the appended claims.

What is claimed:

1. A reversibly programmable non-volatile memory element comprising a thin layer of polycrystalline silicon having an impurity concentration in the range of $10^{17}$ to $10^{20}$ atoms per cubic centimeter and a pair of electrode means connected to said thin layer for applying a voltage having a ramped trailing edge to switch said element from a high to a low resistance state and a voltage having a straight trailing edge to switch said element from a low to a high resistance state.

2. A reversibly programmable non-volatile memory element according to claim 1 wherein said layer is formed on an insulative layer, and said electrode means makes contact to each end of said layer.

3. A reversibly programmable non-volatile memory element according to claim 1 wherein said layer is formed in an aperture in an insulative layer on a substrate, and said electrode means includes a doped impurity region of said substrate below said layer forming one terminal, and a second terminal on the top of said layer.

* * * * *